United States Patent [19]

Bickerdike et al.

[11] 4,245,823

[45] Jan. 20, 1981

[54] APPARATUS FOR PRODUCING MECHANICALLY-WORKED VAPOR-DEPOSITED BULK ALLOYS

[75] Inventors: Robert L. Bickerdike, Alton; Garyth Hughes; William N. Mair, both of Farnham, all of England

[73] Assignee: The Secretary of State in Her Britannic Majesty's Government of the United Kingdom of Great Britain and Northern Ireland, London, England

[21] Appl. No.: 938,236

[22] Filed: Aug. 30, 1978

Related U.S. Application Data

[62] Division of Ser. No. 663,359, Mar. 3, 1976, abandoned.

[30] Foreign Application Priority Data

Mar. 6, 1975 [GB] United Kingdom ................ 9440/75

[51] Int. Cl.$^3$ .............................................. C21D 1/74
[52] U.S. Cl. ..................................... 266/211; 118/44; 118/722; 118/729; 266/250; 266/276; 427/251; 427/355; 75/135
[58] Field of Search .......................... 266/99, 208–211, 266/250, 276; 75/135; 148/6, 6.3, 6.31, 6.35; 427/250, 251, 355–357, 367; 118/44, 600, 608, 48, 722, 729; 241/193–195

[56] References Cited

U.S. PATENT DOCUMENTS

| 2,714,995 | 8/1955 | Jensen | 241/195 |
| 2,958,530 | 11/1960 | Kucera et al. | 241/194 |
| 3,044,719 | 7/1962 | Mary | 241/194 |
| 3,161,412 | 12/1964 | Ferris | 241/193 |
| 3,335,555 | 8/1967 | Woodbring | 241/193 |
| 3,632,406 | 1/1972 | Clough et al. | 118/48 |

FOREIGN PATENT DOCUMENTS 2003636 8/1971 Fed. Rep. of Germany.

Primary Examiner—L. Dewayne Rutledge
Assistant Examiner—Michael L. Lewis
Attorney, Agent, or Firm—Stevens, Davis, Miller & Mosher

[57] ABSTRACT

The porosity of bulk alloys produced by deposition of the components of the alloy from the vapor phase can be reduced if the surface of the alloy is mechanically worked, preferably by a peening action, during the course of the deposition.

Suitable apparatus for mechanically working the surface of the alloy are sets of hammers or flails driven by a suitable means that they strike the surface of the alloy with sufficient force to flatten asperities produced during the course of the deposition and preferably sufficient to remove porosity adjacent to the surface, yet do not at the same time grossly distort the surface of the alloy.

4 Claims, 3 Drawing Figures

APPARATUS FOR PRODUCING MECHANICALLY-WORKED VAPOR-DEPOSITED BULK ALLOYS

This is a division of application Ser. No. 663,359 filed Mar. 3, 1976, now abandoned.

The invention relates to improved processes for the production of bulk alloys in which the alloy is produced by deposition of the constituents of the alloy from the vapour phase and to apparatus for carrying out the aforesaid processes.

Processes for the production of bulk alloys by deposition of the components of the alloy from the vapour phase onto a temperature controllable collecting surface are known. An example of such a process is described in UK Pat. No. 1,206,586.

Alloys produced by vapour phase deposition usually have a columnar structure with the direction of growth tending towards the source of the vapour and contain porosity associated with the columnar structure especially if the temperature of the collecting surface is low. The presence of porosity in these alloys can be detrimental to their properties and is often removed by pressing or rolling the alloy produced. Subjecting the alloy to an extra production step is undesirable and it is also found that when an alloy contains metals having stable oxides, for example aluminium or magnesium, when the alloy is exposed to the atmosphere prior to pressing or rolling oxygen from the atmosphere can penetrate the alloy to form an oxide film on the internal surface of the pores hence introducing an extra, and in some cases undesirable, constituent into the body of the alloy. Pressing or rolling an alloy having a large degree of porosity can also be difficult as the pores can act as nuclei for crack formation.

Methods of reducing the porosity of deposited alloys have been attempted previously. For example UK Pat. No. 1,265,965 describes the introduction of thin layers of minor alloying constituents during deposition to periodically introduce surface renucleation, thus limiting the size of the columnar growth and hence porosity. The method has the potential disadvantage of introducing a separate microstructural constituent however and increases the complexity of the apparatus used and the degree of process control required.

According to the present invention a process for the production of a bulk alloy by deposition of the constituents of the alloy from the vapour phase on to a temperature controllable collecting surface includes the improvement wherein the surface of the alloy is mechanically worked during the course of the deposition.

Preferably the mechanical working is by means of apparatus capable of working the surface of a peening action. For example mechanically driven hammers or flails are suitable. Other forms of mechanical working, for example a rolling action may also be effective.

The mechanical working may be carried out periodically in situ during the deposition or alternatively the surface may be alternately subjected to deposition and mechanical working. Continuous mechanical working of the surface of the alloy in situ during the deposition has been found impracticable as the apparatus required to carry out the mechanical working impedes the access of the vapour to the surface.

It has been found that by subjecting the surface of the alloy to mechanical working during the course of the deposition the amount of porosity in the alloy produced is significantly reduced. The severity of the mechanical working should be sufficient to flatten asperities produced during deposition yet insufficient to create additional steps and asperities. Advantageously the severity of the mechanical working is sufficient to remove porosity adjacent to the surface of the alloy.

The invention also relates to apparatus for the production of a bulk alloy from the vapour phase which includes a source of metal vapour, a temperature controllable collecting surface onto which metal emanating form the source of metal vapour can deposit and mechanical working means whereby the surface of the alloy deposited can be mechanically worked during the course of the deposition.

Conveniently the alloy is alternately subjected to deposition and mechanical working, and in a preferred embodiment the source of metal vapour and the mechanical working means are fixed within the apparatus and the temperature controllable collecting surface for the alloy is movable within the apparatus and adapted so that it may be repositioned to be alternately subjected to deposition and mechanical working.

Advantageously the apparatus by which the surface of the alloy is mechanically worked is sets of hammers or flails driven by a suitable means so that they strike the surface of the alloy.

In a specific embodiment of the invention the apparatus by which the surface of the alloy is mechanically worked comprises a set of hammers. Preferably the heads of the hammers are arranged in a line and the surface of the alloy mechanically worked by causing it to pass over the heads of the hammers in a direction transverse to the line of hammer heads so that the surface is lightly tapped by the heads of the hammers. Advantageously such hammers have rounded tungsten heads.

Preferably the collector or hammers are displaced laterally by a small increment at each pass to ensure that its surface is evenly subjected to mechanical working and that grooves are not formed as would occur if such displacement did not take place. The ability to move the collector can also allow a more even deposit of alloy to be obtained.

In another embodiment of the invention the mechanical working means includes a shaft, a sleeve rotatably mounted on the shaft, a plurality of metal bars attached around the circumference of the sleeve with their axes parallel to the axis of the shaft, a plurality of flails threaded onto the bars and in a fixed lateral position thereon but free to rotate thereabout and drawing means capable of rotating the said sleeve and wherein the mechanical working means is positioned within the apparatus so that the temperature controllable collecting surface can be moved in a direction transverse to the major axis of the sleeve within the path of the flails when the sleeve is rotated.

In operation the collector is moved across the flails in a direction transverse to and perpendicular to the axis of sleeve so that the flails strike the surface, and thus mechanically work the surface of the alloy. Advantageously the lateral positioning of the flails on the bars is determined by spacers threaded onto the bars with the flails so that the position of the flails on respective bars are staggered to ensure that the surface of the alloy is worked evenly. Advantageously edges of the flails which strike the surface have a smooth curved surface and have rounded edges so that a generally boat shaped depression with no sharp edges is made in the alloy each time the flail strikes the surface. The weight of the flails and their speed of rotation is chosen so that each flail forms a shallow depression in the alloy.

The severity of mechanical working of the alloy should be sufficient to flatten any asperities which may be produced during deposition, and preferably sufficient to remove any porosity adjacent to the surface if present. The mechanical working should not be too severe however otherwise distortion of the surface to create additional steps or asperities can occur.

The invention will now be illustrated, by way of example only with reference to the accompanying drawings of which:

FIG. 3 is a side view showing the transverse profile of flails suitable for use in the apparatus of FIG. 2.

Figure 1:
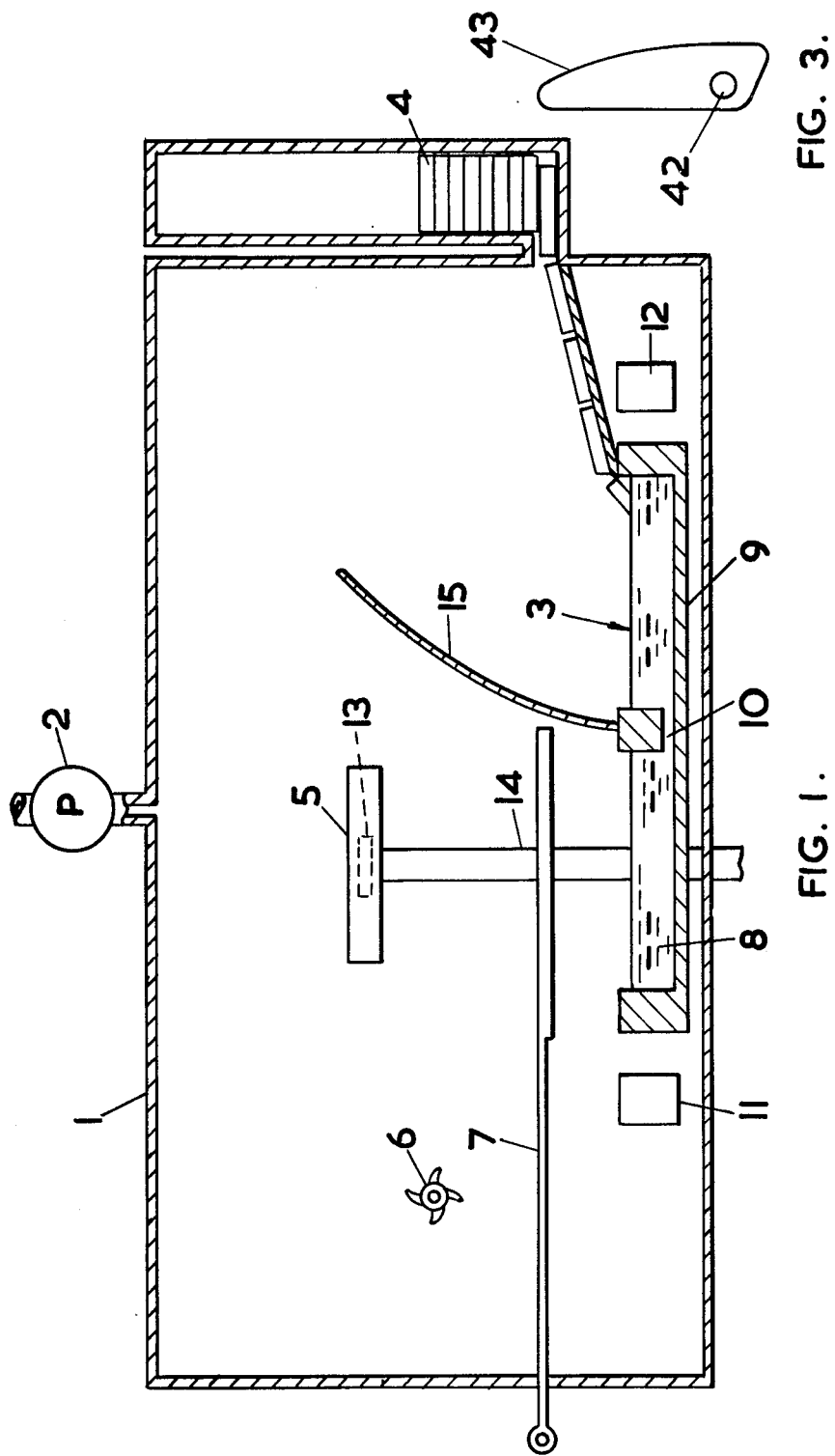
FIG. 1 is a schematic diagram of an apparatus for the bulk deposition of alloys from the vapour phase.

As is shown in FIG. 1, the apparatus for depositing a bulk alloy from the vapour phase includes a vacuum chamber 1 which can be evacuated by a standard vacuum pumping system 2. Located within the vacuum chamber 1 is an evaporative source 3 provided with a metal supply means 4, a movable collector 5, apparatus 6 for mechanically working the surface of the alloy deposited on the underside of the movable collector 5 and a movable shutter 7.

The evaporative source 3 has a metal melting compartment 9 and an evaporation compartment 8, the compartments connected by a submerged channel 10. The compartments 8 and 9 are heated by electron guns 11 and 12 respectively and in operation the compartments 8 and 9 and channel 10 are filled with molten metal.

The collector 5 contains a water circulation system (not shown) and electrical heaters (not shown) whereby the temperature of its lower surface can be regulated. The construction of the collector is similar to that described in U.K. Pat. No. 1,443,144. The collector 5 is supported on an arm 13 attached to a pivot 14 whose end extends out of the vacuum chamber 1 to allow the collector 5 to be moved in the horizontal plane and positioned over the apparatus 6 for mechanically working the alloy surface and the evaporation compartment 8 when required. The movable shutter 7 is designed so that it may be positioned between the collector 5 and evaporative compartment 8 or removed from that position as required.

A further shutter 15 is positioned permanently between the melting compartment 9 and the collector 5 to shield the collector from metal vapour emanating from this compartment when the apparatus is in use.

Figure 2:
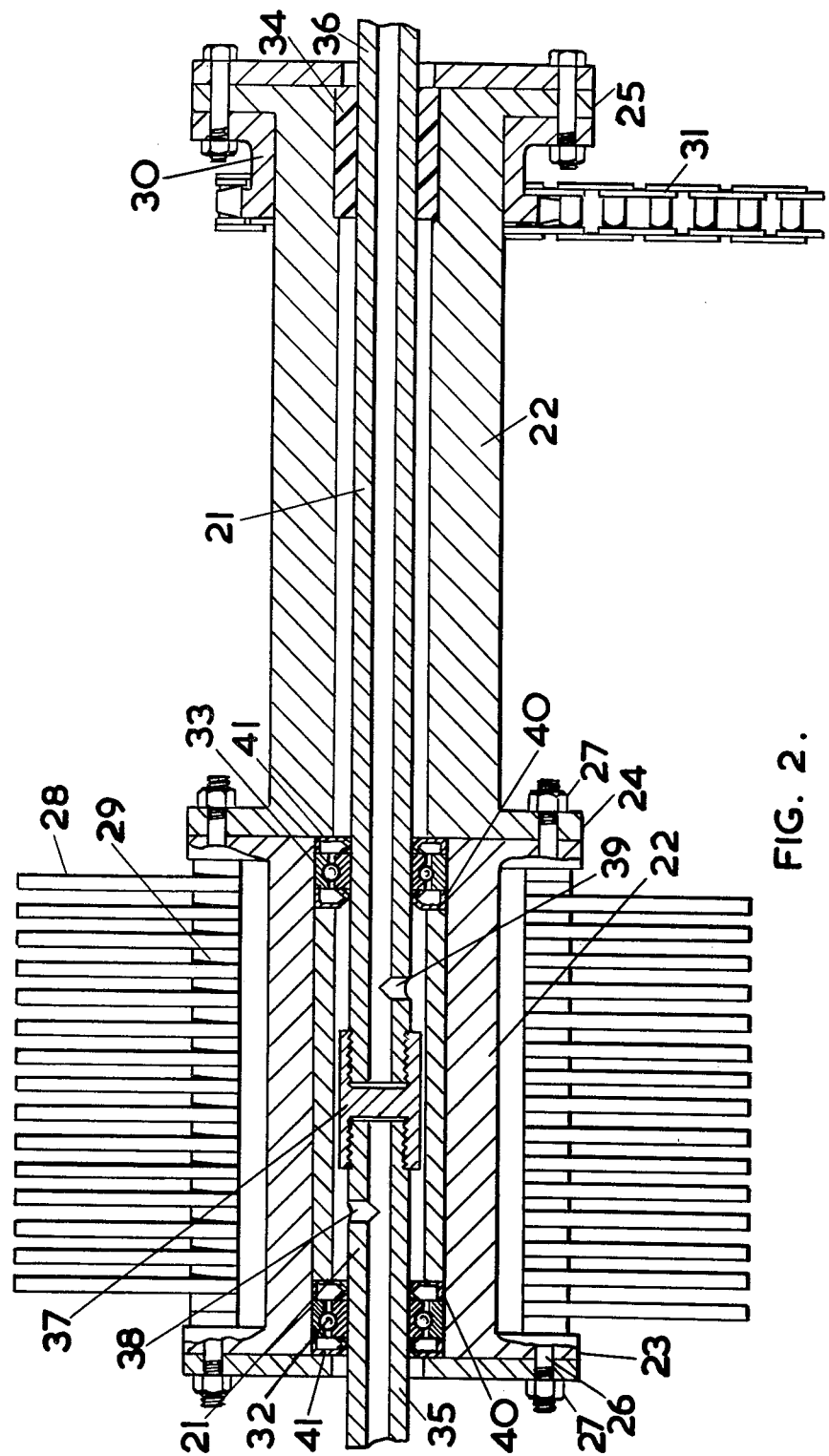
FIG. 2 is a part diagram of the apparatus incorporated into the apparatus of FIG. 1 for mechanically working the surface of the alloy deposit during the course of the deposition.

The apparatus 6 for mechanically working the surface of the alloy will now be described in greater detail with reference to FIG. 2 which shows a non-rotating shaft 21 attached at either end to the vacuum chamber 1 (mounting not shown). A sleeve 22 is rotatably mounted upon the shaft 21 on ball races 32 and 33 and a PTFE washer 34. Four equispaced bars 26 are mounted between flanges 23 and 24 by bolts 27 with their axes parallel to and equidistant from the axis of the shaft 21. Flails 28 separated by washers 29 are mounted on the bars 26. The washers 29 determine the lateral positioning of flails 28 whilst allowing them freedom of rotation about the bar 26. The sleeve 22 is arranged to be rotated by means of a sprocket 30 mounted on a flange 25 through a chain 31 from a second sprocket and electric motor (not shown).

As the apparatus is operated in a hot evacuated environment an internal water cooling system is incorporated by forming the spindle from two lengths of pipe 35 and 36 whose ends are connected together to form a single shaft by a joining member 37 which is positioned between the ball races 32 and 33. Holes 38 and 39 in the pipes 35 and 36 complete the water circulation system. In use water is circulated down pipe 35 through hole 38 into the space between the sleeve 22 and the shaft 1 between bearing races 32 and 33, through hole 39 into pipe 36 from whence it leaves the apparatus. Gaco seals 40 act as seals to prevent the water seepage into the evacuatable part of the alloy deposition with Gaco seals 41 acting as a back-up should the Gaco seals 40 fail. In addition to acting as a back-up should the seals on the water cooling system fail, Gaco seals 41 prevent contamination of the bearing races 32 and 33 by for example metal vapour and prevent traces of lubrication used in the ball races from contaminating the evacuable part of the apparatus.

It should be noted that the sleeve 22 is constructed of a number of sections for ease of manufacture and maintenance.

In operation the collector 5 is positioned over the evaporation compartment 8 with the shutter 7 positioned over the compartment. The chamber 1 is then evacuated and the metal in compartments 8 and 9 heated by electron guns 11 and 12 to their operating temperature and maintained at this temperature. When the compartments have reached their operating temperature the shutter is moved so that metal evaporating from the evaporation compartment 8 can deposit onto the lower surface of the collector 5. After a short period the the collector 5 is slowly moved over the mechanical working apparatus 6 so that the deposit on its lower surface is subjected to mechanical working. The collector 5 is then repositioned over the evaporation compartment and the process repeated until the deposit of alloy on the lower surface of the collector 5 has reached the required thickness.

The composition of the alloy deposited is determined by the composition of the metal vapour evaporating from the evaporation chamber 8, which in turn depends upon the composition and operating temperature of the chamber. It will be realised that the composition of the metal in the chamber 8 can differ greatly from that of the alloy deposited on to the collector 5 due to the differing volatilities of the components of the alloy at the operating temperature of the chamber 8. The operating temperature and composition of the metal in the chamber 8 should be chosen so that the alloy deposit has the composition desired.

The composition of the metal in the melting compartment 9 is chosen to be the same as that of the vapour evaporating from the compartment 8 and losses from the chambers 8 and 9 replaced by adding metal, in ingot form, from metal supply means 4, which is again chosen to have the same composition as that of the metal in the compartment 9.

As the vapour evaporating from evaporation compartment 8 is replaced by metal having the same composition via channel 10, which is in turn replaced by metal from the metal supply means 4 having the same composition, the composition of the metal in the compartments and hence the composition of the alloy deposited will remain substantially constant throughout the deposition process.

The amount of metal deposited on the surface of the collector 5 at each stage of the process is in general determined by the degree of porosity that can be tolerated. If the thickness of alloy deposited at each stage is too great porosity can build up in the alloy and which can not be removed by the mechanical working. On the other hand if the deposit of alloy is too thin, although an alloy having little porosity would be obtained the process would be very time consuming. A balance between the two is therefore required. In general the frequency and amount of mechanical working should be sufficient only to limit the porosity of the alloy to an acceptable level.

The amount of force exerted by the flails on striking the surface of the alloy deposit is determined by the momentum of the flails which in turn is dependent upon the rate of rotation of the sleeve 22.

Both the speed of rotation of the sleeve and the design of the flails should be chosen to achieve the type of mechanical working desired taking into consideration the properties of the alloy deposited.

One of the flails 28 is shown in profile in FIG. 3. The flail is constructed in metal sheet in the shape shown and can be threaded onto one of the bars 26 via hole 42. The leading edges 43 of the flail which strike the surface of the alloy are rounded off so that when the flail strikes the alloy surface a generally boat shaped depression is formed.

The mechanical working should be sufficient to lower the profile of any asperities formed but not of sufficient severity to cause gross distortion of the surface thus producing cracks or sharp protruberances which could cause the introduction of additional porosity.

It will be appreciated that other forms of mechanical working could be used to carry out the invention.

What we claim is:

1. An apparatus for the production of a bulk alloy by evaporation deposition comprising an evacuable chamber, means for forming in vacuo in said chamber an evaporated stream of metal, a collector locatable in said stream to collect an evaporated metal to form an alloy deposit, working means in said evacuable chamber with said evaporated stream for applying a peening action to said alloy deposit on said collector to flatten asperities in the surface of said deposit and thereby inhibit formation of voids in said alloy deposit comprising (1) a row of rotatable hammers arranged when rotated to strike said alloy deposit sufficiently lightly so as not to produce steps or asperities in the surface of said alloy deposit and (2) means for rotating said hammers so they strike said alloy deposit once per rotation, said working means including a rotating means and a plurality of mountings attached to said rotating means and rotatable therewith, said rotatable hammers attached to said mountings and being free to rotate relative to said rotating means, and means for moving said collector into a position where it is in said stream and a position which is in a path of the heads of said hammers when rotated, the movement of said collector being in a direction into the rotating path of said hammers.

2. The apparatus of claim 1 wherein said means for moving said collector is arranged so as to move said collector periodically between a position in the stream and a position lateral of the stream and adjacent to the working means.

3. The apparatus of claim 1 wherein said hammers have a curved striking surface with rounded edges.

4. The apparatus of claim 1 wherein said rotating means comprises a shaft and a sleeve having an axis of rotation rotatably mounted on said shaft and said mountings comprise bars attached around said sleeve with their axes parallel to the axis of said sleeve, said hammers being rotatably mounted on said bars perpendicular to said axis of rotation.

* * * * *